United States Patent
Shyu et al.

(10) Patent No.: US 6,819,593 B2
(45) Date of Patent: Nov. 16, 2004

(54) ARCHITECTURE TO SUPPRESS BIT-LINE LEAKAGE

(75) Inventors: Der-Shin Shyu, Hsinchu (TW); Hung-Cheng Sung, Hsin-chu (TW); Li-Wen Chang, Taipei (TW); Han-Ping Chen, Hsin-Chu (TW); Chen-Ming Huang, Jungli (TW); Ya-Chen Kao, Taoyuan (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 75 days.

(21) Appl. No.: 10/318,458

(22) Filed: Dec. 13, 2002

(65) Prior Publication Data

US 2004/0114435 A1 Jun. 17, 2004

(51) Int. Cl.[7] .............................................. G11C 16/00
(52) U.S. Cl. ............................ 365/185.17; 365/185.18; 365/185.27
(58) Field of Search ....................... 365/185.17, 185.18, 365/185.27, 185.11

(56) References Cited

U.S. PATENT DOCUMENTS

| | | | |
|---|---|---|---|
| 5,808,338 A | 9/1998 | Gotou | 257/315 |
| 5,838,617 A | 11/1998 | Bude et al. | 365/185.18 |
| 6,046,932 A | 4/2000 | Bill et al. | 365/185.02 |
| 6,285,593 B1 | 9/2001 | Wong | 365/185.23 |
| 6,570,787 B1 * | 5/2003 | Wang et al. | 365/185.17 |
| 6,711,063 B1 * | 3/2004 | Dejenfelt et al. | 365/185.21 |

* cited by examiner

Primary Examiner—Tan T. Nguyen

(57) ABSTRACT

A method to suppress bit-line leakage in a nonvolatile memory cell is achieved. The method comprises providing an array of nonvolatile memory cells comprising source and bulk terminals. The array comprises a plurality of subarrays. The sources of all the nonvolatile cells in each subarray are coupled together to form a common subarray source. Bulks of all the nonvolatile cells in the array are coupled together to form a common array bulk. A first, non-zero voltage is forced between the common subarray source and the common array bulk for a first subarray that is selected for an access operation. A second, non-zero voltage is forced between the common subarray source and the common array bulk for a second subarray that is not selected for an access operation. The second, non-zero voltage inhibits bit line leakage in the second subarray.

20 Claims, 3 Drawing Sheets

ARCHITECTURE TO SUPPRESS BIT-LINE LEAKAGE

BACKGROUND OF THE INVENTION (1) Field of the Invention

The invention relates to a method to improve a nonvolatile memory cell, and, more particularly, to a method to suppress bit-line leakage in a nonvolatile memory cell.

(2) Description of the Prior Art

Nonvolatile memory, such as EEPROM and Flash EEPROM, is used in many electronics applications. Nonvolatile memory combines the capability of writing data and maintaining data during power down. It is typical in the art for nonvolatile memory arrays to comprise thousands of even millions of memory cells.

Referring now to FIG. 1, an exemplary flash memory cell 10 is shown in cross section representation. As is common in the art, the flash memory cell 10 comprises two transistors having separate bit lines 18 and a common source 22. Each transistor forms a single storage bit of memory. Each transistor further comprises a floating gate electrode 34 and a control gate electrode 38. The flash transistors are turned ON or OFF based on the voltage on the control gates 26 and 30. The amount of charge trapped on the floating gates 34 determines the threshold voltages of the two devices. Charge is moved onto or off of the floating gates by biasing the control gates 38, bit lines 18, and source line 22 to cause a large voltage potential from floating gate 34 to substrate 14 or to control gate 38.

Further, the flash cells 10 are typically formed in arrays of devices across the wafer substrate 14. These cells are coupled to form units of memory such as bytes, words, or pages, as is well known in the art. In a typical arrangement, the control gates 38 of a row or column of cells are coupled together such that group of control gates 38 forms a word line that is selected as a group. In addition, in a typical arrangement, the common source connection 22 between a pair of cells is also shared with other cells in the local array.

To read a flash bit, the word line is biased to a reading voltage while a small bias is forced from bit line 18 to source 22. The current flow through the transistor is then sensed to determine if the transistor has been turned ON. In this way, the voltage threshold, relative to the reading voltage, can be determined, and the floating gate state (charged or non-charged) can be deduced.

The floating gate 34 and control gate 38 of the flash transistors may be formed as a stacked gate or as a split gate. In a stacked gate, the control gate overlies the flash gate but does not otherwise overlie the substrate 14. In a stacked gate flash or EEPROM transistor, the channel region is formed only underlying the floating gate. In a split gate device, the control gate may be formed to couple charge onto the floating gate and to overlie the substrate. In this way, the control gate 38 can control a part of the transistor channel. The exemplary flash cell of FIG. 1 shows split gate transistors. A circuit symbol for a flash transistor 40 is also illustrated.

Referring now to FIG. 2, an exemplary array 50 of flash cells is illustrated. In this array 50, each flash transistor is represented by the circuit symbol introduced in FIG. 1. Several features of the array should be noted. First, the common sources between a pair of cells, such as C00 and C01, are further coupled to a common VSS signal. The VSS signal is the common source for the entire array 50. The bit line signals BL0, BL1, and BL2 are coupled to all of the bit line terminals of a given row of cells. However, each row has an independent bit line. The word line signals WL0, WL1, WL2, and WL3 are coupled to all of the control gates in a given column. However, each column has a separate word line.

In this configuration, it is possible to address a particular cell of the array 50 by selecting a single bit line and a single word line. Erasing operating conditions are particularly shown in FIG. 2. The word lines, bit lines, and common source are biased such that cell C12 66 is selected for erasing. In particular, BL1 is driven to a selection voltage of about 0.5 Volts while BL0 and BL2 are driven to a non-selection voltage of about 1.65 Volts. Further, WL2 is driven to a selection voltage of about 1.5 Volts while WL0, WL1, and WL3 are driven to non-selection voltages of about 0 Volts. Finally, the common source lines VSS are all driven to about 7 Volts. In this state, the selected transistor C12 66 is biased to cause a discharge of electrons from the floating gate.

Note that all of the cells within the array 50 are also effected by the erasing operation. For example, all of the transistors in the WL2 column will also see the selection voltage on the control gate. Therefore, cells C02 56 and C22 76 will experience word line disturbance. All of the cells coupled to BL1 will see the selection voltage on the bit line node. Therefore, cells C10 62, C11 64, and C13 68 will experience bit line disturbance. All of the cells in the page will see the selection voltage on the common source VSS. Therefore, cells not in the row or column with the selected cell will experience the elevated large VSS voltage of about 7 Volts during the erase.

It is further found that the array 50 may comprise a subsection, or page, of the larger memory array. Yet, it is common in such arrays to couple a large number of cell bit line regions to common bit line signals. For example, BL0 signal may be coupled to several array pages across the memory. The combination of a bit line selected and a word line selected will cause selection of the correct cell for erasing, programming, or reading. However, to reduce the source line stress on unselected cells, the common VSS voltage is set to zero volts in the non-selected pages of memory. This approach has an unintended consequence, however. It is found that bit line leakage in these non-selected cells can occur. Since there are many such non-selected cells, the combined leakage current can be unacceptably large.

Several prior art inventions relate to nonvolatile memory devices. U.S. Pat. No. 6,285,593 B1 to Wong discloses a word line decoder for a multiple level memory. Leakage current is reduced by applying a negative voltage to unselected word lines. Selected or unselected word lines are held at ground. U.S. Pat. No. 5,808,338 to Gotou describes a nonvolatile semiconductor memory. U.S. Pat. No. 5,838,617 to Bude et al discloses a method to program EPROM or EEPROM devices. A negative substrate bias is used. U.S. Pat. No. 6,046,932 to Bill et al shows a circuit to reduce bit line current during programming or overerase correction. A resistance is added to the common source line.

SUMMARY OF THE INVENTION

A principal object of the present invention is to provide an effective method to reduce bit line leakage in a nonvolatile memory device.

A further object of the present invention is to provide a method reduce bit line leakage in non-selected cells of a nonvolatile memory device by providing a non-zero common source to substrate voltage.

Another object of the present invention is to provide a nonvolatile memory device having a reduced bit line leakage.

A further object of the present invention is to reduce bit line leakage in non-selected cells of a nonvolatile memory device by providing a non-zero common source to substrate voltage.

In accordance with the objects of this invention, a method to suppress bit-line leakage in a nonvolatile memory cell is achieved. The method comprises providing an array of nonvolatile memory cells comprising source and bulk terminals. The array comprises a plurality of subarrays. The sources of all the nonvolatile cells in each subarray are coupled together to form a common subarray source. Bulks of all the nonvolatile cells in the array are coupled together to form a common array bulk. A first, non-zero voltage is forced between the common subarray source and the common array bulk for a first subarray that is selected for an access operation. A second, non-zero voltage is forced between the common subarray source and the common array bulk for a second subarray that is not selected for an access operation. The second, non-zero voltage inhibits bit line leakage in the second subarray.

Also in accordance with the objects of this invention, a nonvolatile memory cell device is achieved. The device comprises an array of nonvolatile memory cells comprising source and bulk terminals. The array comprises a plurality of subarrays. The sources of all the nonvolatile cells in each subarray are coupled together to form a common subarray source. The bulks of all the nonvolatile cells in the array are coupled together to form a common array bulk. A means to force a first, non-zero voltage between the common subarray source and the common array bulk is provided for a first subarray that is selected for an access operation. A means to force a second, non-zero voltage between the common subarray source and the common array bulk is provided for a second subarray that is not selected for the access operation. The second, non-zero voltage inhibits bit line leakage in the second subarray.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method and device to reduce bit line leakage in non-selected cells in a nonvolatile memory array. It should be clear to those experienced in the art that the present invention can be applied and extended without deviating from the scope of the present invention.

Figure 1:
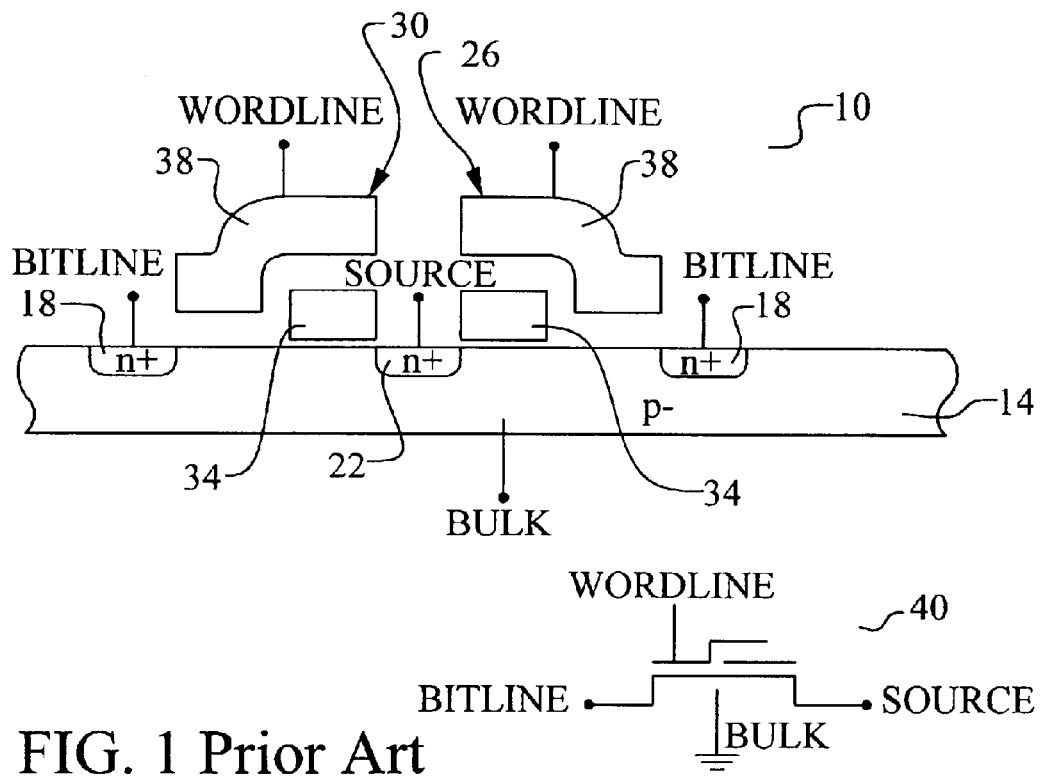
FIG. 1 illustrates a nonvolatile memory cell in cross section.
Figure 2:
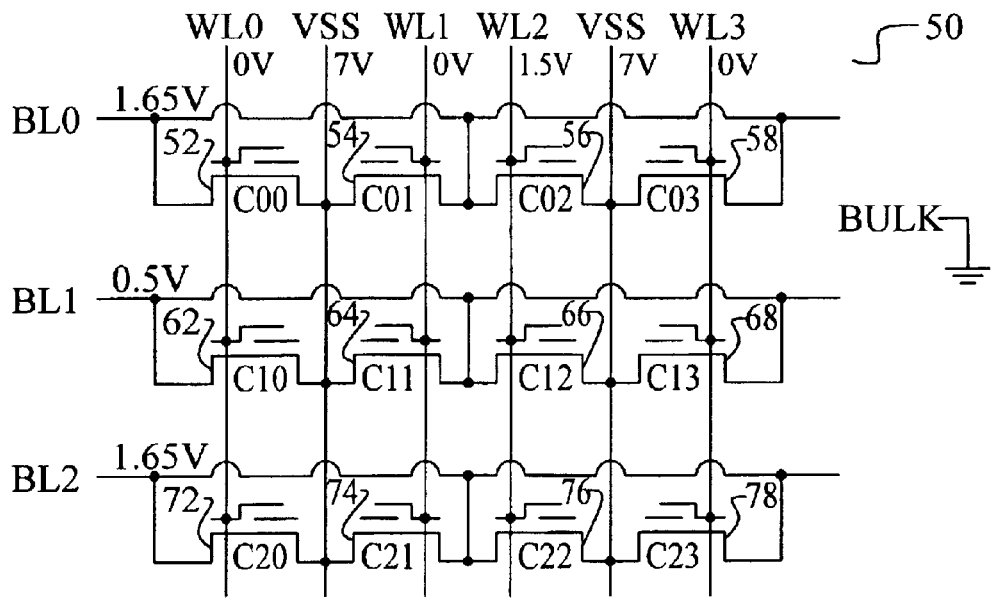
FIG. 2 illustrates a section of nonvolatile memory.
Figure 3:
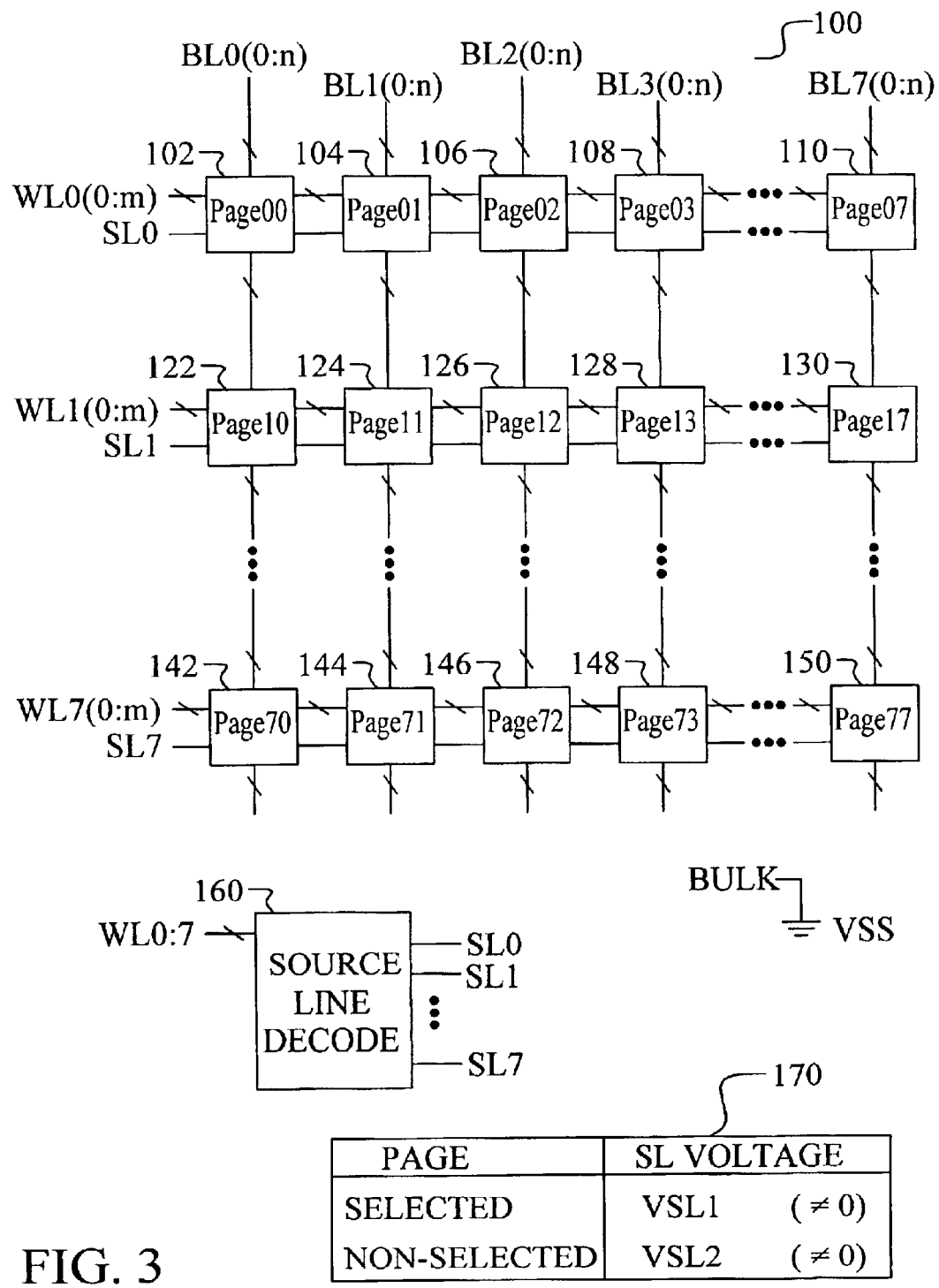
FIG. 3 illustrates a preferred embodiment of the present invention.

Referring now to FIG. 3, the preferred embodiment of the present invention is illustrated. Several important features of the present invention are shown and discussed below. The method comprises providing an array 100 of nonvolatile memory cells comprising source and bulk terminals. The nonvolatile memory cells may comprise EEPROM or flash transistors. More preferably, the cells comprise split gate flash transistors as shown in FIG. 1. Referring again to FIG. 3, the flash transistors may comprise n-channel or p-channel devices. The array 100 further comprises a plurality of subarrays 102 through 150. These subarrays may comprise pages of memory as is known in the art.

As an important feature of the present invention, the sources (SL0 through SL7) of all the nonvolatile cells in each subarray 102 through 150 are coupled together to form a common subarray source. For example, the common source SL1 is coupled to the source side of all memory cells in page10 122, page11 124, page12 126, page13 128, through page17 130. Alternative routings of the common source line are possible. The key is to provide common source coupling for subarrays within the overall memory array 100 so that bit line current can be eliminated in the non-selected subarrays while still enabling access functions, such as writing, erasing, and reading, in the selected subarray.

As another important feature, bulks of all the nonvolatile cells in each subarray 102 through 150 are coupled together to form a common subarray bulk. Referring again to FIG. 1, the bulk is shown for an n-channel device as the substrate 14. Alternatively, the bulk of the memory cell transistors may be a well. Referring again to FIG. 3, a common bulk connection of all of the memory cells in the array 100 is used. Preferably, a common ground reference VSS is used as the common array bulk BULK for the array 100 if the cells are n-channel. A positive supply could be used as the common array bulk for a p-channel cell type. As in the prior art, the word line signals WL0 through WL7 are preferably routed to a plurality of pages in a first direction across the array 100. Meanwhile, the bit line signals BL0 through BL7 are routed in a second direction across the array 100.

As an important feature of the present invention, a first, non-zero voltage VSL1 is forced between the common subarray source SL0 through SL7 and the common array bulk BULK for a first subarray that is selected for an access operation. For example, an access, such as a program, erase, or read, is proposed for a cell in page 12 126 of the memory array 100. Therefore, the bit line signal BL2(x) is set to the selected state while the remaining bit lines are set to the non-selected state. Meanwhile, the word line signal WL1(x) is set to the selected state while the remaining word line signals are set to the non-selected state. Most significantly, the common source line signal, SL1, for all of the pages page10 122 through page 17 130, is set to the selected voltage of VSL1.

Now as a most important feature, the method of the present invention provides a unique setting for the common source lines of the non-selected pages. Generally, a second, non-zero voltage VSL2 is forced between the common subarray source and the common array bulk for a second subarray, or page, that is not selected for an access operation. To complete the example, the first row of pages page00 102 through page07 110 has a different common source signal SL0 than the common source signal SL1 for the selected cell location. The row comprising page70 142 through page77 150 also comprises a different common source line SL7. The unique method of the present invention distinguishes between selected and non-selected sections of the memory array 100. The non-selected array area receives the second, non-zero voltage VLS2. This second, non-zero voltage VSL2 inhibits bit line leakage in the second subarray.

The second, non-zero voltage VSL2 provides voltage bias between the source and the bulk of every non-selected cell in the non-selected pages. By providing this source-to-bulk bias, VSL2 causes two effects. First, a body effect is created for the transistor. Second, the lateral field, from drain-to-source, is reduced when compared to the prior art method of coupling the source to the bulk in non-selected cells. The combined effect of the VSL2 voltage is to reduce bit line leakage in every non-selected cell in the non-selected pages. This reduces the overall leakage current of the memory device.

Stopping leakage by the body effect may not be sufficient. In particular, in many flash technologies, the body of the devices is the p-type substrate. In this case, it is not possible to efficiently stop leakage via the body effect. In these case, the present invention further teaches forcing a higher voltage on the sources of non-selected cells than on the drains. This will either change the leakage path of the devices or stop channel leakage directly.

Figure 4:
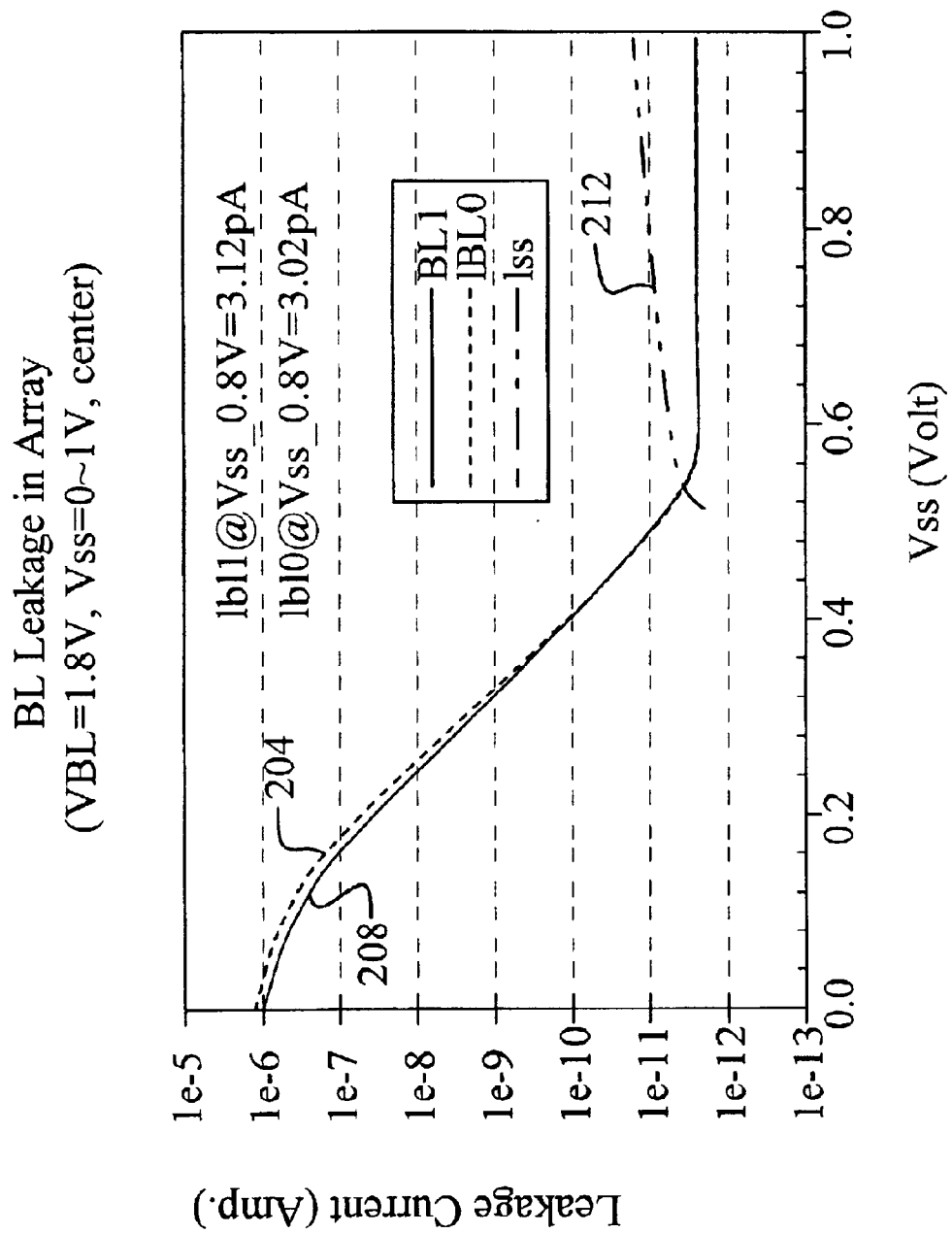
FIG. 4 illustrates the body effect on a nonvolatile memory cell.

Referring now to FIG. 4, the effect of the source-to-bulk voltage is seen for a memory cell device. Specifically, the VSS voltage is varied between about 0 Volts and about 1 Volt with respect to the bulk. The bit line leakage is shown for two devices 204 and 208. The leakage is substantially reduced from about 0 Volts to about 0.5 Volts. Preferably, the VSL2 voltage on non-selected cells is set for between about 0.8 Volts and the positive supply voltage. More preferably, the VSL2 voltage of non-selected cells is forced to a higher voltage than the drain (bitline) voltages of these same non-selected cells.

Referring again to FIG. 3, a means to force 160 the common source line voltages SL0 through SL7 is shown. The source line decode 160 creates the voltage conditions given by the table 170. At any time, only one of the common source subarray signals SL0 through SL7 is set to the selected voltage VSL1 while the remaining signals are set to the non-selected voltage VSL2. For example, the selected page common source voltage may be between about 0.8 Volts and the positive supply voltage for an n-channel type memory cell. More preferably, the VSL2 voltage of non-selected cells is forced to a higher voltage than the drain (bitline) voltages of these same non-selected cells.

The advantages of the present invention may now be summarized. An effective method to reduce bit line leakage in a nonvolatile memory device is achieved. Bit line leakage is reduced in non-selected cells of a nonvolatile memory device by providing a non-zero common source to substrate voltage. A nonvolatile memory device having a reduced bit line leakage is achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to suppress bit-line leakage in a nonvolatile memory cell comprising:
providing an array of nonvolatile memory cells comprising source and bulk terminals wherein said array comprises a plurality of subarrays, wherein said sources of all said nonvolatile cells in each said subarray are coupled together to form a common subarray source, and wherein bulks of all said nonvolatile cells in said array are coupled together to form a common array bulk;
forcing a first, non-zero voltage between said common subarray source and said common array bulk for a first said subarray that is selected for an access operation; and
forcing a second, non-zero voltage between said common subarray source and said common array bulk for a second said subarray that is not selected for said access operation wherein said second, non-zero voltage will inhibit bit line leakage in said second subarry.

2. The method according to claim 1 wherein said array of nonvolatile memory cells comprise one of the group consisting of: EEPROM and flash.

3. The method according to claim 1 wherein said nonvolatile memory cells comprise split gate flash cells.

4. The method according to claim 1 wherein said nonvolatile memory cells comprise n-channel devices and wherein said non-zero voltage comprises a positive voltage.

5. The method according to claim 1 wherein said nonvolatile memory cells comprise p-channel devices and wherein said non-zero voltage comprises a negative voltage.

6. The method according to claim 1 wherein said access operation comprises one of the group consisting of: reading, writing, and erasing.

7. The method according to claim 1 wherein said subarray comprises a page of memory.

8. The method according to claim 1 wherein said second non zero voltage is larger than drain voltages forced on said memory cells of said subarray that is not selected for said access operation.

9. A method to suppress bit-line leakage in a nonvolatile memory cell comprising:
providing an array of nonvolatile memory cells comprising n-channel devices having source and bulk terminals wherein said array comprises a plurality of subarrays, wherein said sources of all said nonvolatile cells in each said subarray are coupled together to form a common subarray source, and array are coupled together to form a common array bulk;
forcing non-zero volts between said common subarray source and said common array bulk for a first said subarray that is selected for an access operation; and
forcing a positive voltage between said common subarray source and said common array bulk for a second said subarray that is not selected for said access operation.

10. The method according to claim 9 wherein said nonvolatile memory cells comprise split gate flash.

11. The method according to claim 9 wherein said access operation comprises one of the group consisting of: reading, writing, and erasing.

12. The method according to claim 9 wherein said subarray comprises a page of memory.

13. The method according to claim 9 wherein said positive voltage is larger than drain voltages forced on said memory cells of said subarray that is not selected for said access operation.

14. A nonvolatile memory cell device comprising:
an array of nonvolatile memory cells comprising source and bulk terminals wherein said array comprises a plurality of subarrays, wherein said sources of all said nonvolatile cells in each said subarray are coupled together to form a common subarray source, and wherein bulks of all said nonvolatile cells in said array are coupled together to form a common subarray bulk;
a means to force non-zero volts between said common subarray source and said common array bulk for a first said subarray that is selected for an access operation; and a means to force a non-zero voltage between said common subarray source and said common array bulk for a second said subarray that is not selected for said access operation.

15. The device according to claim 14 wherein said array of nonvolatile memory cells comprise one of the group consisting of: EEPROM and flash.

16. The device according to claim 14 wherein said nonvolatile memory cells comprise split gate flash cells.

17. The device according to claim 14 wherein said nonvolatile memory cells comprise n-channel devices and wherein said non-zero voltage comprises a positive voltage.

18. The device according to claim 14 wherein said nonvolatile memory cells comprise p-channel devices and wherein said non-zero voltage comprises a negative voltage.

19. The device according to claim 14 wherein said subarray comprises a page of memory.

20. The device according to claim 14 wherein said non zero voltage is larger than drain voltages forced on said memory cells of said subarray that is not selected for said access operation.

* * * * *